(12) United States Patent
Sweis

(10) Patent No.: US 8,997,026 B1
(45) Date of Patent: Mar. 31, 2015

(54) SYSTEM AND METHOD FOR SELF ALIGNMENT OF PAD MASK

(75) Inventor: Jason Sweis, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 455 days.

(21) Appl. No.: 13/470,080

(22) Filed: May 11, 2012

(51) Int. Cl.
*G06F 17/50* (2006.01)

(52) U.S. Cl.
CPC .................................. *G06F 17/5068* (2013.01)
USPC .................... 716/50; 716/51; 716/54; 716/55

(58) Field of Classification Search
USPC ....................................................... 716/50–55
See application file for complete search history.

(56) References Cited

U.S. PATENT DOCUMENTS

| 7,615,496 | B2 | 11/2009 | Lee et al. | |
|---|---|---|---|---|
| 8,003,543 | B2 | 8/2011 | Koh et al. | |
| 2010/0291476 | A1* | 11/2010 | Liu | 430/5 |
| 2011/0018146 | A1* | 1/2011 | Pierrat | 257/797 |
| 2011/0183505 | A1* | 7/2011 | Min et al. | 438/586 |

* cited by examiner

*Primary Examiner* — Paul Dinh
(74) *Attorney, Agent, or Firm* — Kenyon & Kenyon LLP

(57) ABSTRACT

A system and method provide semiconductor fabrication mask creation techniques that align the device features patterned with a first core mask with one or more pad features patterned with a subsequent pad mask. Shapes representing the pad features may be included in the core mask by reducing on all sides, the shape of the pad feature in the core mask by the width of the spacer material. A pad mask then may be created to include a shape of the pad feature that may overlap a portion of the spacer material pattern created by the shape of the pad feature in the core mask. Data sets may be generated from a circuit design to create the masks that may be fabricated with the described techniques.

19 Claims, 17 Drawing Sheets

300

400

410

500

SYSTEM AND METHOD FOR SELF ALIGNMENT OF PAD MASK

BACKGROUND

Aspects of the present invention relate generally to the field of integrated circuit design, and more specifically to self-alignment of features in the "Pad" mask. The Pad mask is used in the process of positive tone self-aligned double patterning (SADP). There are 3 masks involved in this method of Double Patterning Technology (DPT): 1) The core or mandrel mask, 2) The trim mask, and 3) The Pad mask. Positive tone SADP is where the spacer becomes the drawn feature and therefore limits drawn features to the single spacer size. Any features drawn wider than a spacer are placed on the Pad mask.

Integrated circuit (IC) design is increasingly complex, sometimes involving millions of elements, shapes or geometries, and may be facilitated with an electronic design automation (EDA) tool that allows a designer to interactively position ("place") and connect ("route") various shapes on the circuit. The EDA tool then creates a circuit layout containing the physical locations and dimensions of the circuit's components, interconnections, and various layers from the original design that may then be fabricated, creating the IC. The designed IC is eventually fabricated by transferring or printing the circuit layout to a semiconductor substrate in a series of layers that collectively will form the features that constitute the devices that make up the components of the integrated circuit. However, as the shapes and the spaces between shapes being patterned are often smaller than 40 nm, the ability to transfer an accurate design involving small and closely spaced components onto the substrate is limited by the physical constraints of the photolithography process.

For example, when very small shapes are included as part of the design, alignment is critical. Small misalignments of the shapes etched into the substrate may result in misconnections, feature breaks, and shorts. Alignment is particularly difficult for features that are transferred to the substrate using separate masks in a double or multi-patterning technology. For example, small closely packed features, each having a width less than 40 nm or spaced within 40 nm of each other, may conventionally be patterned with a first mask and larger features may be subsequently patterned with a second mask. Therefore, exact alignment of features on the first mask with the features on the second mask is difficult and often problematic.

Accordingly, there is a need in the art to ensure proper alignment of features patterned on a semiconductor substrate using multiple masks.

BRIEF DESCRIPTION OF THE DRAWINGS

The foregoing and other aspects of various embodiments of the present invention will be apparent through examination of the following detailed description thereof in conjunction with the accompanying drawing figures in which similar reference numbers are used to indicate functionally similar elements.

DETAILED DESCRIPTION

Figure 1A:
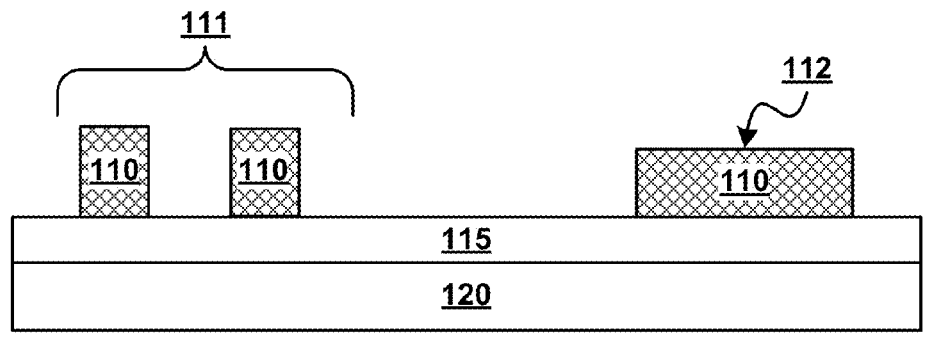
FIGS. 1(A)-(F) illustrate an exemplary embodiment of a self-aligned double patterning process according to an embodiment of the present invention.

After or during the design and creation of an IC layout, validation and/or optimization operations are often performed on the IC layout using a set of testing, analysis and validation tools. These operations are conventionally performed in part to detect variations in the as-designed layout that may occur during printing due to the optical and/or chemical nature of the processing used to manufacture the IC. For example, optical distortions during the lithography process may cause variations in feature dimensions (e.g. line widths) that are patterned using masks. Optical proximity correction (OPC) tools make small changes to the layout, for example adjusting line widths or adding rounded corners to the design layout, so that the design layout and the printed circuit more closely align.

As part of the validation/optimization process, a decomposition tool may transform a target design into multiple functional blocks and determine a set of masks that, when combined during the lithography process, will create the layout design. A mask provides an image of the physical geometries of its respective integrated circuit blocks. For example, the decomposition tool may identify a core mask that provides the pattern for critical features, a trim mask used to remove or trim unwanted spacer features, and a third mask that provides the pattern for larger "pad" features. For the purpose of this application, critical features may be understood to be those features that are spaced or sized at the minimum constraint for a self-aligned double patterning (SADP) process. For example, critical features may include a set of periodic features each having a width and space equal to the width of a spacer, or an array of similarly spaced lines. Then according to one method of photolithography, by passing light through the transparent sections of the masks, the layout pattern is transferred onto the substrate.

The decomposition process may be configured to derive masks that provide accurate alignment of features conventionally patterned with multiple masks by utilizing both the core mask and the pad mask to pattern pad features according to embodiments of the present invention. Thus embodiments of the present invention provide such self alignment techniques to accurately align pad and critical features patterned with a first core mask with one or more pad features conventionally patterned entirely with a subsequent pad mask. Additionally, the embodiments provide techniques to pattern pad features within the minimum spacing conventionally required for shapes patterned with a pad mask.

Shapes representing the pad features may be included in the core mask by reducing, on all sides, the shape of the pad feature in the core mask by the minimum width of the shapes that may be patterned on the substrate using SADP. This minimum width is typically the width of the spacer material remaining after the spacer material is preferentially removed from the substrate during the SADP process. The shape of the pad feature subsequently included in the pad mask may be designed to overlap a portion of the spacer material pattern created by the shape of the pad feature in the core mask, thereby assuring proper alignment of the pad feature with the features in the core mask without necessitating exact alignment of the pad mask. This is assuming that the equipment overlay capability does not exceed the spacer width.

FIGS. 1(A)-(F) illustrate an exemplary embodiment of a self-aligned double patterning process according to an embodiment of the present invention. As shown in FIG. 1(A), a first layer 110 may be deposited over one or more expendable or hard mask layers 115, which are deposited over the substrate 120 that is to be patterned with the target layout. The first layer 110, also known as the sacrificial layer, may be made of poly-silicon or a material that may be etched or patterned using photolithography and then selectively removed.

As illustrated in FIG. 1(A), the first layer 110 may be patterned to include shapes that will result in both the critical features 111 and at least one pad feature 112, thereby ensuring that the pad feature 112 is properly aligned with the critical features 111.

Figure 1B:
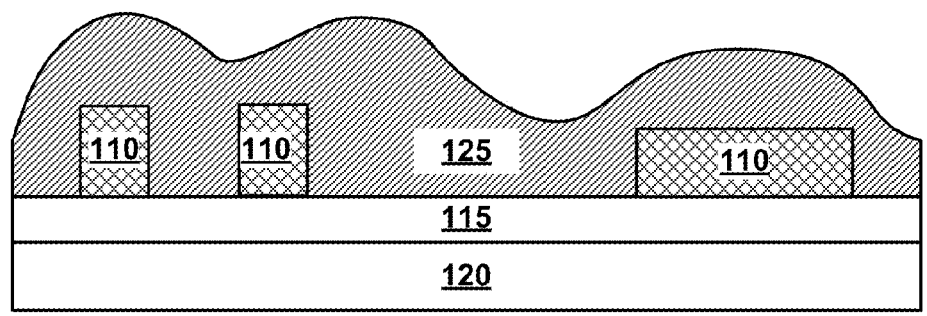
Figure 1C:
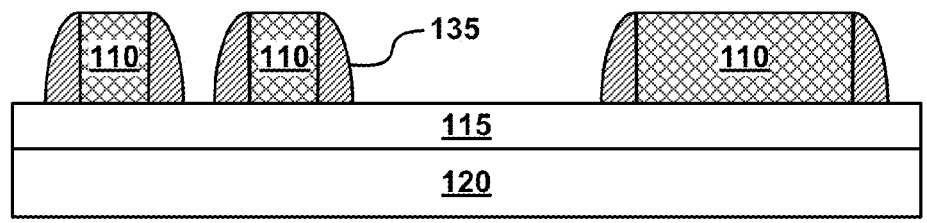

As shown in FIG. 1(B), a spacer material 125, for example, silicon nitride, silicon oxide, or silicon oxynitride, may then be deposited over the patterned first layer 110. The dielectric spacer material 125 is usually conformal, although FIG. 1(B) does not necessarily represent that aspect. The spacer material 125 may then be etched as illustrated in FIG. 1(C) so as to preferentially remove the spacer material 125 deposited on the horizontal surfaces, leaving narrow patterns of spacer material 135 attached to the sidewalls of the patterned first layer 110.

Figure 1D:
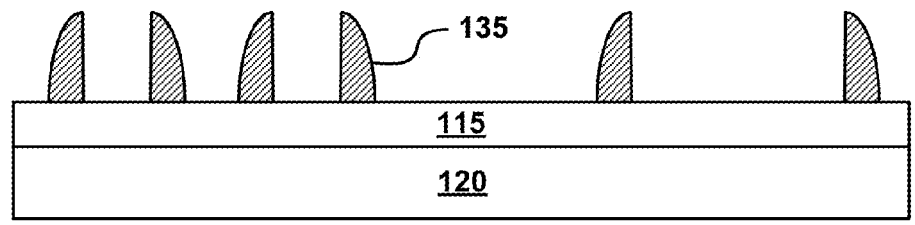

Then, as shown in FIG. 1(D), the remaining patterned first layer 110 may be removed or etched away. Then the pattern remaining on the hardmask 115 and substrate 120 is defined by the narrow spacer pattern 135. A trim mask may then be applied to remove unnecessary portions of the spacer pattern 135.

Figure 1E:
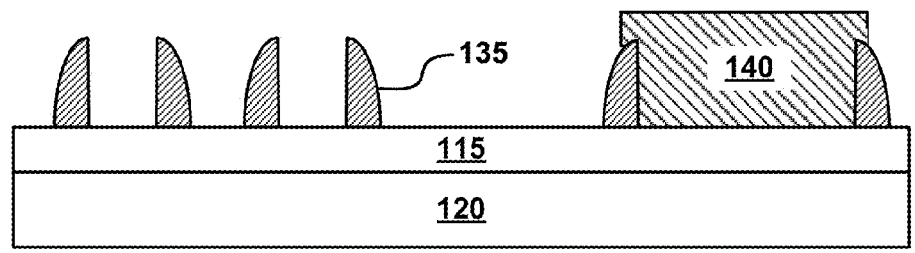
Figure 1F:
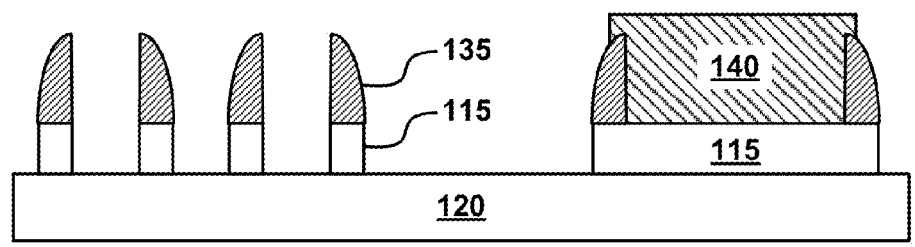

As shown in FIG. 1(E), a subsequent hardmask 140 may be deposited over the spacer pattern 135, which may include overlapping a portion of the spacer pattern 135 with the new hardmask 140. A subsequent etch process may then remove the exposed first hardmask 115, transferring both the spacer pattern 135 and the pad pattern 140 to the underlying substrate layer 120 as illustrated at FIG. 1(F). The substrate layer 120 may be etched to form trenches in the regions exposed by the transferred patterns.

Figure 2A:
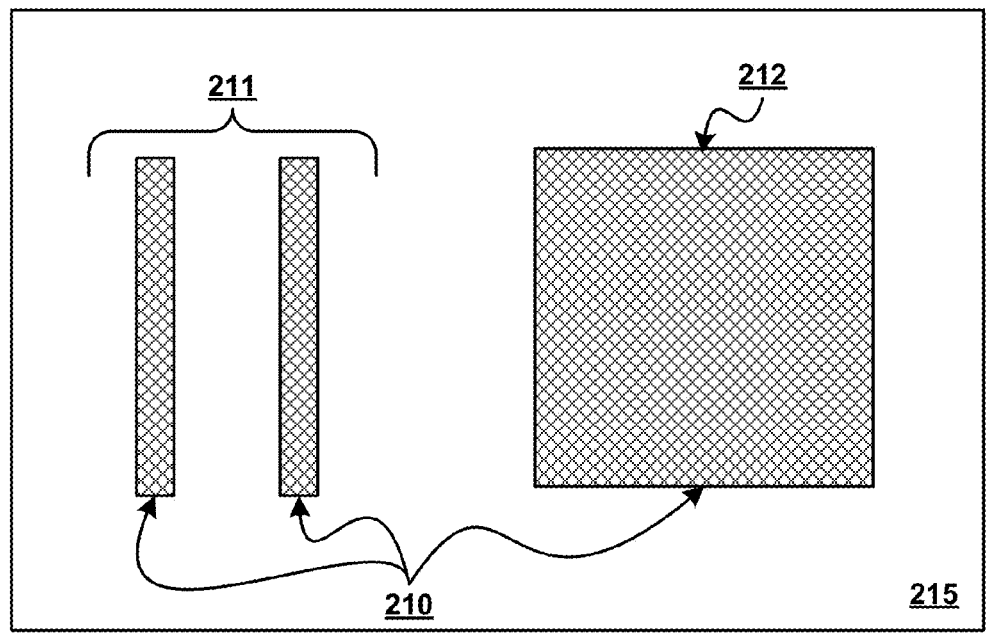
FIGS. 2(A)-(E) illustrate a top view of an exemplary self-aligned double patterning process according to an embodiment of the present invention.
Figure 2B:
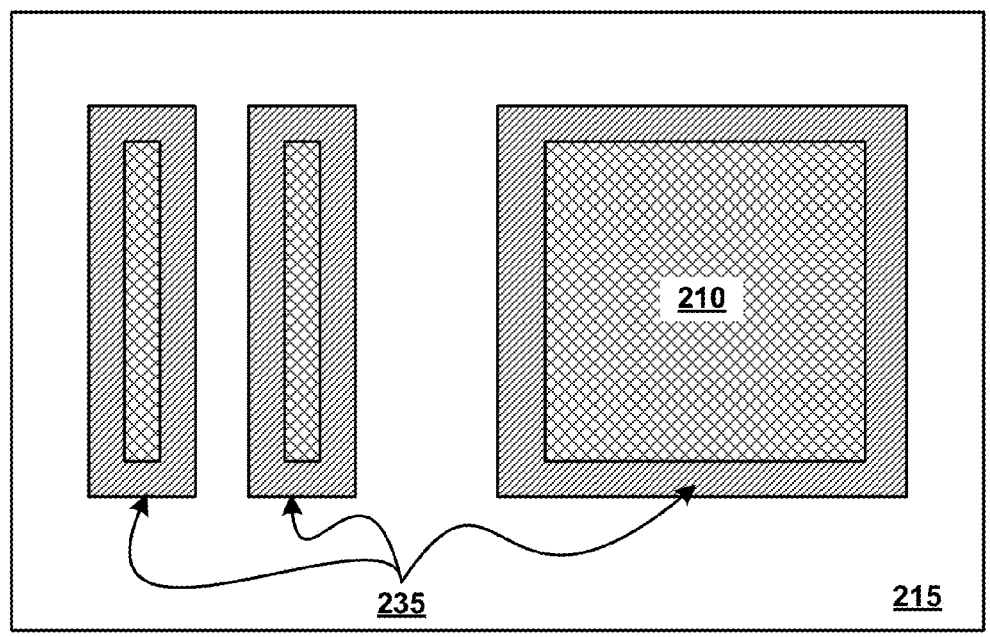

FIGS. 2(A)-(D) illustrate a top view of an exemplary self-aligned double patterning process as shown in FIG. 1(A)-(F) according to an embodiment of the present invention. As shown in FIG. 2(A), a sacrificial layer 210 may be patterned on the hard mask layer 215 to define patterns that may result in the etching of both the critical features 211 and at least one pad feature 212, thereby ensuring that pad feature 212 is properly aligned with the critical features 211. Then a spacer material may be deposited over the sacrificial layer and etched away from the horizontal surfaces to provide the spacer pattern 235 as shown in FIG. 2(B).

Figure 2C:
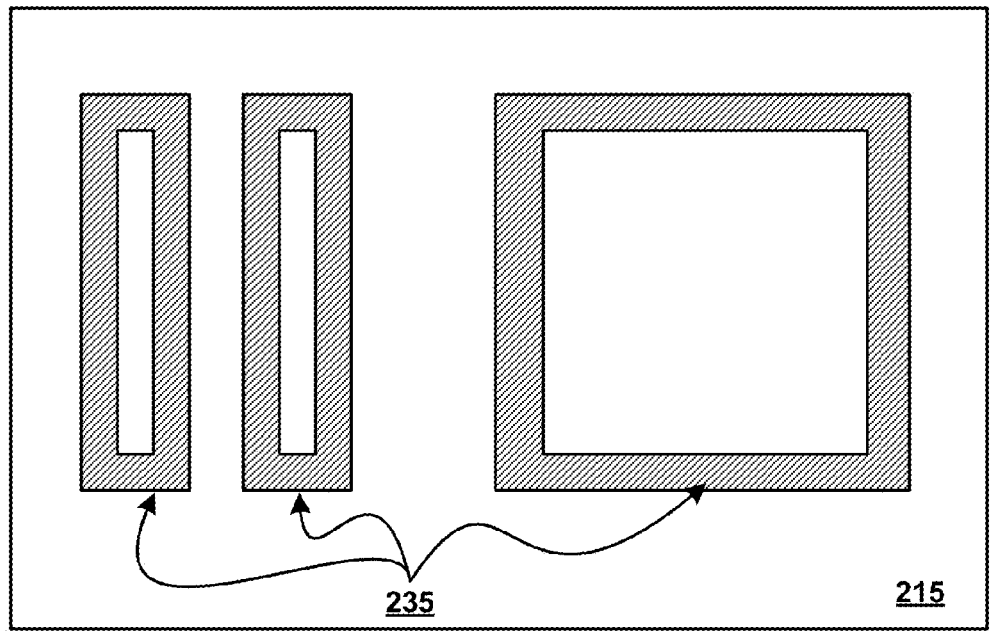
Figure 2D:
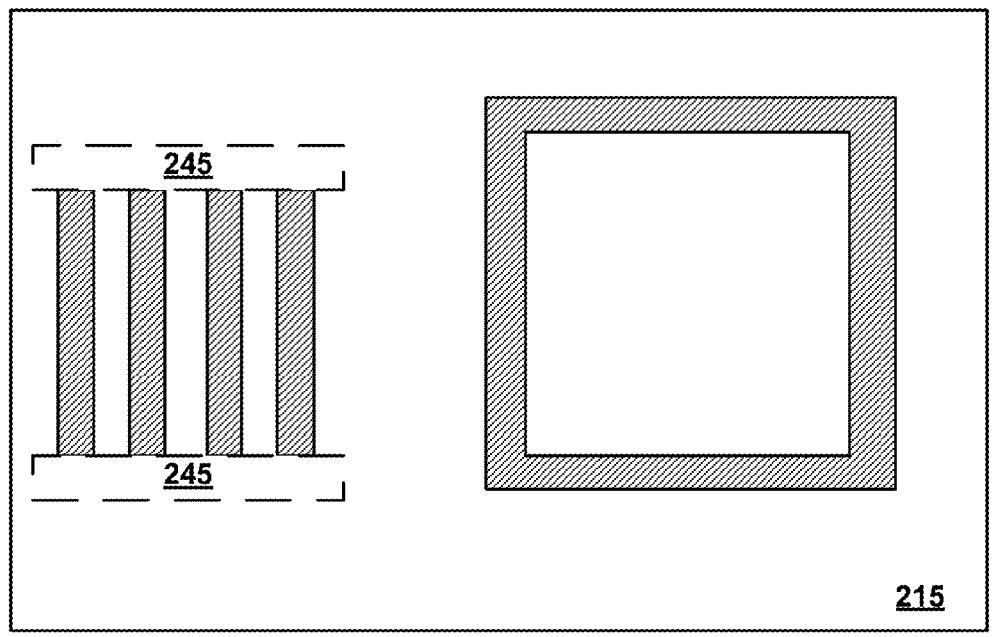

As shown in FIG. 2(C), the patterned sacrificial layer 210 may then be removed or etched away. The pattern remaining on the hardmask 215 after the sacrificial layer 210 is removed is defined by the spacer pattern 235. FIG. 2(D) illustrates an exemplary spacer pattern 235 after a trim mask 245 is applied to remove a portion of the spacer pattern.

Figure 2E:
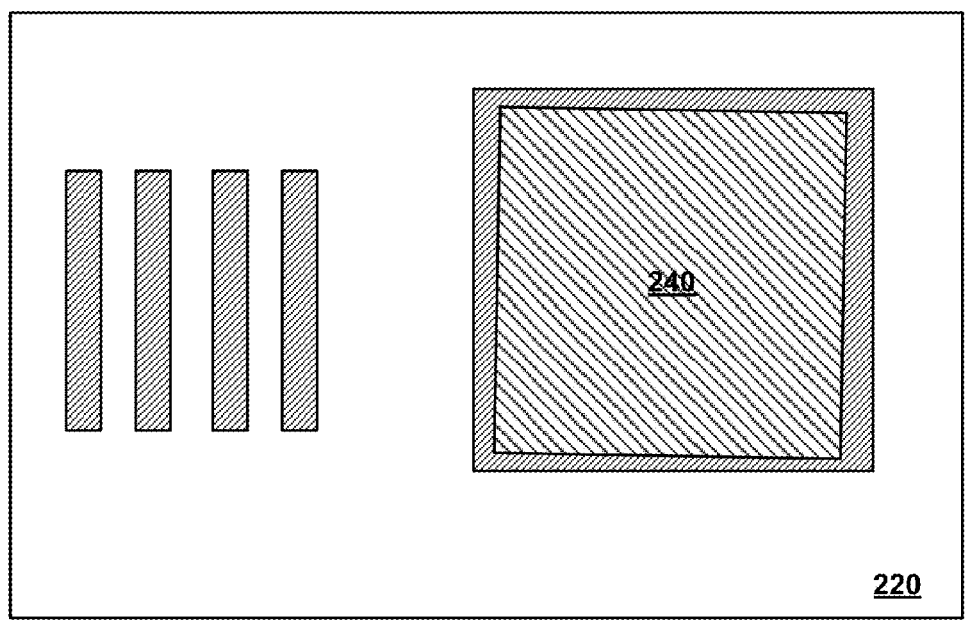

As shown in FIG. 2(E), a pad feature 240 may be patterned with a hardmask deposited over the spacer pattern 235. The pad feature 240 may be patterned in the hardmask to overlap a portion of the spacer pattern 235. For example, the pad feature 240 in the hardmask may be larger than the pad feature 212 defined by the sacrificial layer 210, but smaller than the pad feature 212 combined with the spacer pattern 235, such that the pad feature fits within the spacer pattern 235. Then such overlap may provide accurate alignment of the pad feature with the critical features by way of patterning the boundary of the pad feature on the same mask as the critical features. A subsequent etch process may then remove the exposed first hardmask 215, transferring both the spacer pattern 235 and the pad feature 240 on the underlying substrate layer 220.

Figure 3:
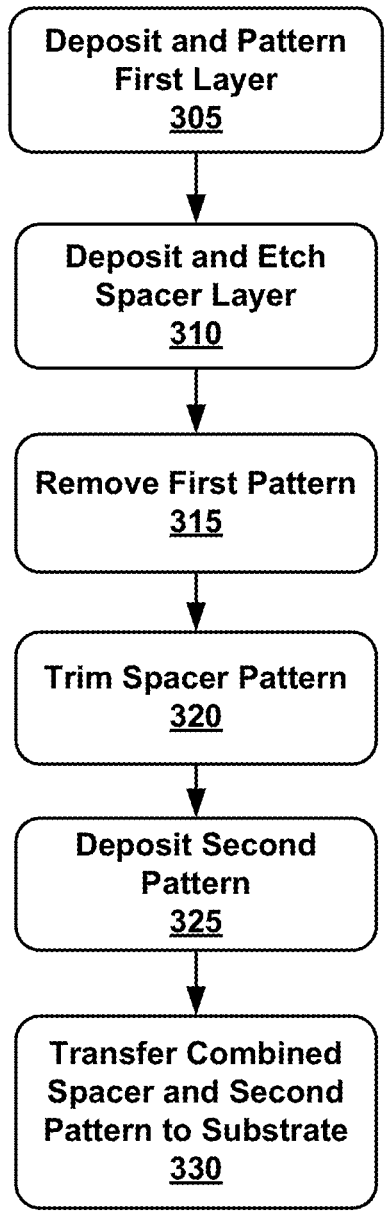
FIG. 3 is a flowchart illustrating an exemplary method for patterning a set of features onto a substrate in accordance with an embodiment of the present invention.

FIG. 3 is a flowchart illustrating an exemplary method 300 for patterning a set of features onto a substrate in accordance with an embodiment of the present invention. This method may be used to pattern a set of small and closely spaced features accurately aligned with one or more larger pad features using lithography operations.

As shown in FIG. 3, using a core mask, a first layer deposited onto a substrate is patterned, thereby forming a first pattern (block 305). In one embodiment, the first pattern is a first subset of shapes designed to pattern a subset of features on the substrate, such features including a set of critical features and at least one pad feature aligned with the critical features. In this example process, the first layer can be a polysilicon or like material. As described previously, the first layer can be referred to as a sacrificial layer as it is used to define a pattern of sidewall spacer material (block 310) and then subsequently is removed (block 315).

After the first pattern is formed, a layer of a spacer material may be deposited on the substrate over the first pattern and selectively removed (block 310). In this example, the spacer material may be etched to remove the spacer material from horizontal surfaces of the underlying layer while leaving a pattern of spacer material adjacent the sacrificial material. The deposition and removal of the spacer material may be executed using conventional spacer deposition and etch processes. For example, the spacer material can be etched anisotropically, preferentially removing the spacer material on the horizontal surfaces. The remaining spacer material may have a consistent width against the vertical surfaces of the sacrificial pattern. In one embodiment, the spacer etch areas are further defined by a photomask operation in which a layer of photoresist is deposited and a mask used to cure the resist in areas where the spacer material is to remain. After the spacer material is etched, the remaining spacer pattern may define a spacer pattern.

After the spacer pattern is formed, the first pattern may be removed (block 315). The first pattern may be removed from the substrate using selective etching techniques thereby leaving the spacer pattern on the substrate. Then, the spacer pattern may be trimmed using a trim mask that removes any spacer material that will not be used to create the target pattern on the substrate (block 320).

Then, using a pad mask, a second pattern may be deposited over the spacer pattern (block 325). In one embodiment, the second pattern is a second subset of shapes designed to pattern a set of features on the substrate, such features including the at least one pad feature in the first pattern. As previously described, the second pattern may be formed in a hardmask layer.

The remaining spacer pattern and second pattern then may be used to pattern the set of features onto the substrate (block 330). For example, the substrate can be etched to form trenches into the underlying layer in areas where there is no spacer material. As an alternative, the layer can be metalized to add conductive materials in the trenches formed by the spacer material.

Figure 4A:
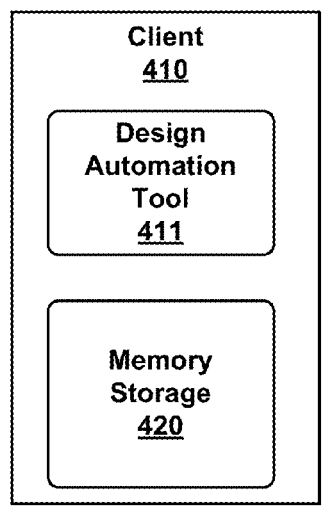
FIGS. 4(A)-(B) are simple block diagrams illustrating components of an exemplary system according to an embodiment of the present invention.

The masks described with respect to FIG. 3 may be created by a design automation tool during decomposition of a circuit design. A user may access an integrated circuit design editor or other design layout tool utilizing layout validation and deconstruction tools in a standalone client system, client-server environment, or a networked environment. FIG. 4(A) is a simple block diagram illustrating components of an exemplary system 400 according to an embodiment of the present invention. As shown in FIG. 4(A), a system 400 may comprise a client 410 executing a design automation and deconstruction tool 411 and having a memory storage 420. The client 410 may be any computing system, including a special-purpose or general-purpose computing device, that executes a deconstruction tool 411 or otherwise facilitates access to memory storage 420 may be used to derive masks for use in a lithography process to pattern a circuit layout onto a semiconductor substrate, for example a personal computer.

Layouts, sets of design rules, masks, and other objects utilized by the design layout tool may be stored in memory storage 420. Other objects stored in the memory storage device 420 may include elements, shapes, cells, pages or circuits that make up a multiple layouts and packages. A user may access the objects stored in memory storage 420 with the client 410 via a design automation tool 411 capable of accessing memory storage 420 and displaying the layouts masks, and related circuit design data stored therein. The design automation tool 411 may include a user interface, for example a program, application or middleware that acts as a frontend to and facilitates access to objects in memory storage 420, for example, a schematic or circuit design editor or other design editing application. The design automation tool 411 may facilitate synchronized deconstruction of design layouts into a set of one or more lithography masks using the display and edit tools and procedures described herein. The user may interact with the design automation tool 411 through a number of input devices, such as by inputting a selection as with a mouse or inputting a request as with a keyboard. The user may observe the response to the access request on an output device or display. The design automation tool 411 may run in an application window controlled by the user. The instructions for executing the design automation tool may additionally be stored in memory storage 420.

Figure 4B:
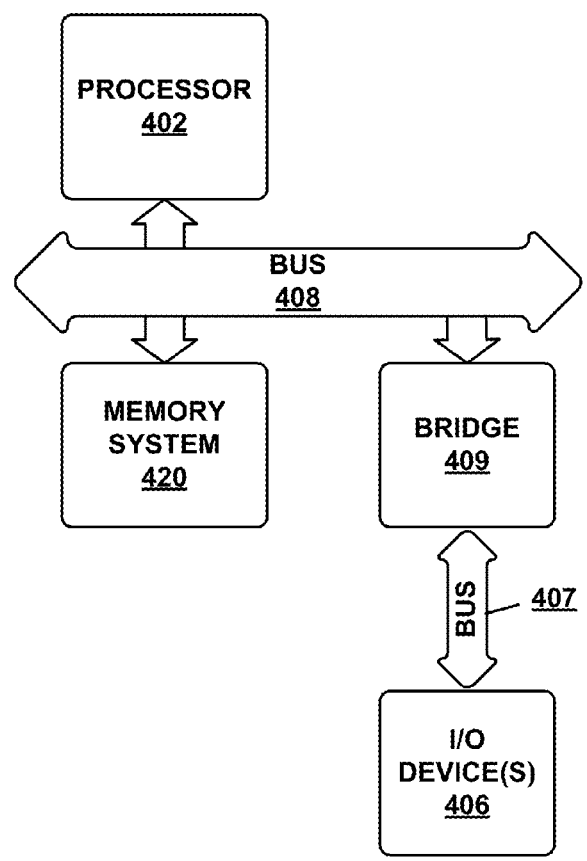

FIG. 4(B) is a simple block diagram illustrating components of an exemplary client 410 according to an embodiment of the present invention. As shown in FIG. 4(B), the client 410 may include a processor 402, a memory system 420 and one or more input/output (I/O) devices 406 in communication. The communication can be implemented in a variety of ways and may include one or more computer buses 407, 408 and/or bridge devices 409 as shown in FIG. 4(B). The I/O devices 406 can include network adapters and/or mass storage devices from which the client 410 can receive commands for executing the design automation tools 411.

As shown in FIG. 4(A), a client 410 may be a stand-alone system, as may be of particular interest where the designs being developed are highly confidential. Additionally, according to an aspect of an embodiment as shown in FIG. 5, a client 510 may be part of a networked environment.

Figure 5:
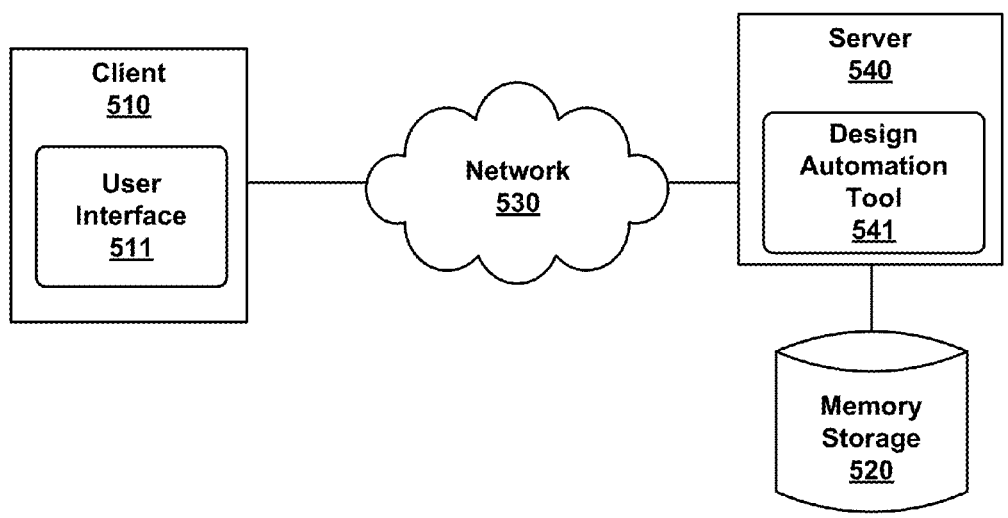
FIG. 5 is a simple block diagram illustrating components of an exemplary system according to an embodiment of the present invention.

FIG. 5 is a simple block diagram illustrating components of an exemplary system 500 according to an embodiment of the present invention. As shown in FIG. 5, system 500 may comprise a client 510 having a user interface 511. The client 510 may be connected to a server 540 via a network 530. The design automation tool 541 may have access to memory storage 520 storing layouts, packages and other objects utilized by the design automation tool 541. A user may access a design automation tool 541 at the server via the client 510 having a user interface 511 capable of accessing and displaying stored layouts and objects. The client 510 may be any computing system that facilitates the user accessing memory storage 520, for example a personal computer. The network 530 may be a wired or wireless network that may include a local area network (LAN), a wireless area network (WAN), the Internet, or any other network available for accessing memory storage 520 from the client 510. The instructions for executing the design automation tool may additionally be stored in memory storage 520 or in local memory (not shown) of the client 510.

The server 540 may be a network server accessible to the client 510 via the network 530 that may manage access to memory storage 520. The user interface 511 may receive instructions regarding a layout design, including layout validation and deconstruction, from the user and utilizing the objects stored in memory storage 520, facilitate deconstructing a layout to derive a set of masks for use in the lithography process. Multiple different clients (not shown) may access memory storage 520 via the network 530 and request access to the objects stored therein.

In another networked environment, the design automation tool may be executed on a network capable client and access the layouts, packages and other objects stored in memory storage via a network and communications server.

Using the above described systems, a layout having both critical features and pad features may be deconstructed and masks that may be used in a photolithography process to pattern the design on a semiconductor substrate derived. FIGS. 6(A)-(H) illustrate a top view of an exemplary deconstruction and patterning process according to an embodiment of the present invention.

Figure 6A:
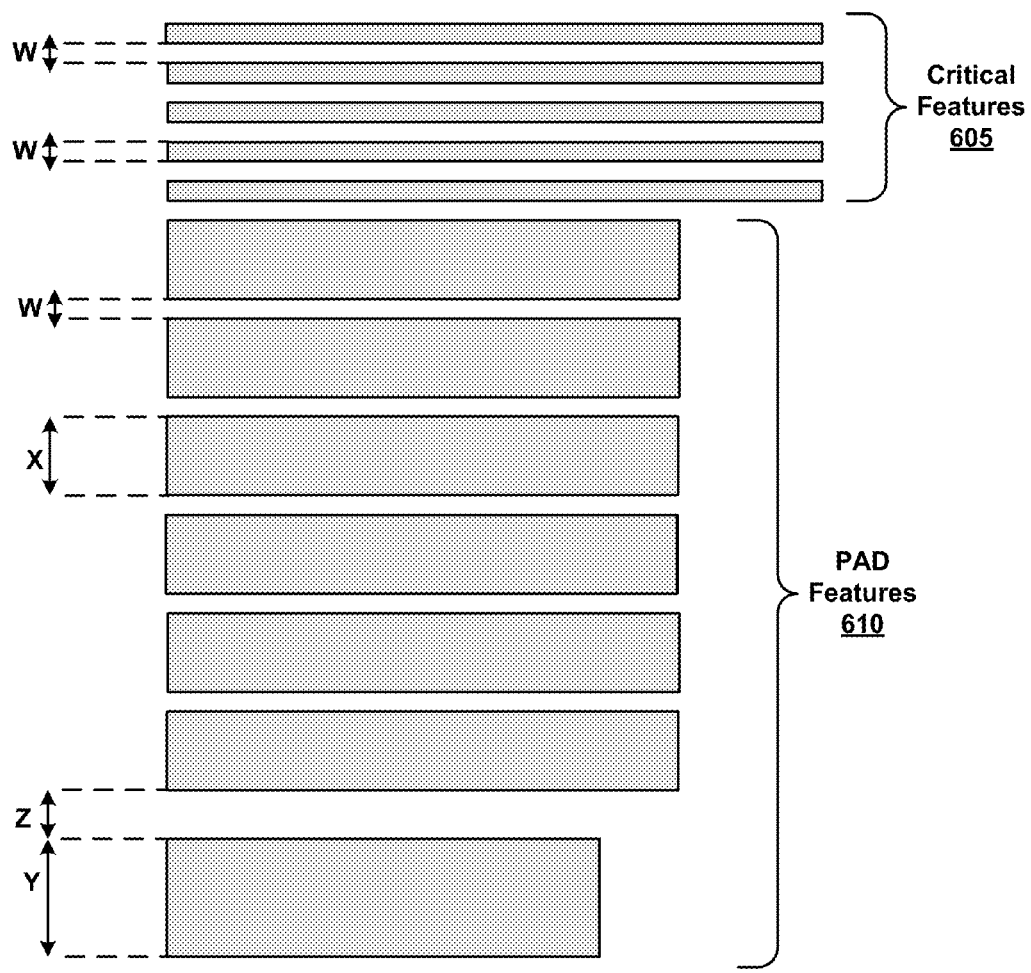
FIGS. 6(A)-(H) illustrate a top view of an exemplary deconstruction and patterning process according to an embodiment of the present invention.

FIG. 6(A) illustrates an exemplary target layout having aligned critical features and pad features. As previously noted, a critical feature may represent a feature that has the minimal width or spacing for the SADP lithography process. For example, in some embodiments, the minimum spacing for features using SADP is 28 nm. As shown, the critical features 605 have a width W and are spaced apart by a width W, where W is the minimal spacing for the SADP process that may be used to pattern the design on a semiconductor substrate. The pad features 610 may have a width greater than W. For example, as shown in FIG. 6(A), the pad features 610 have a width of X or Y. Additionally, the space between a pad feature and another feature may have a width of W or a width greater than W. For example, as shown in FIG. 6(A), the pad features 610 are spaced apart by a width of W or Z.

Figure 6B:
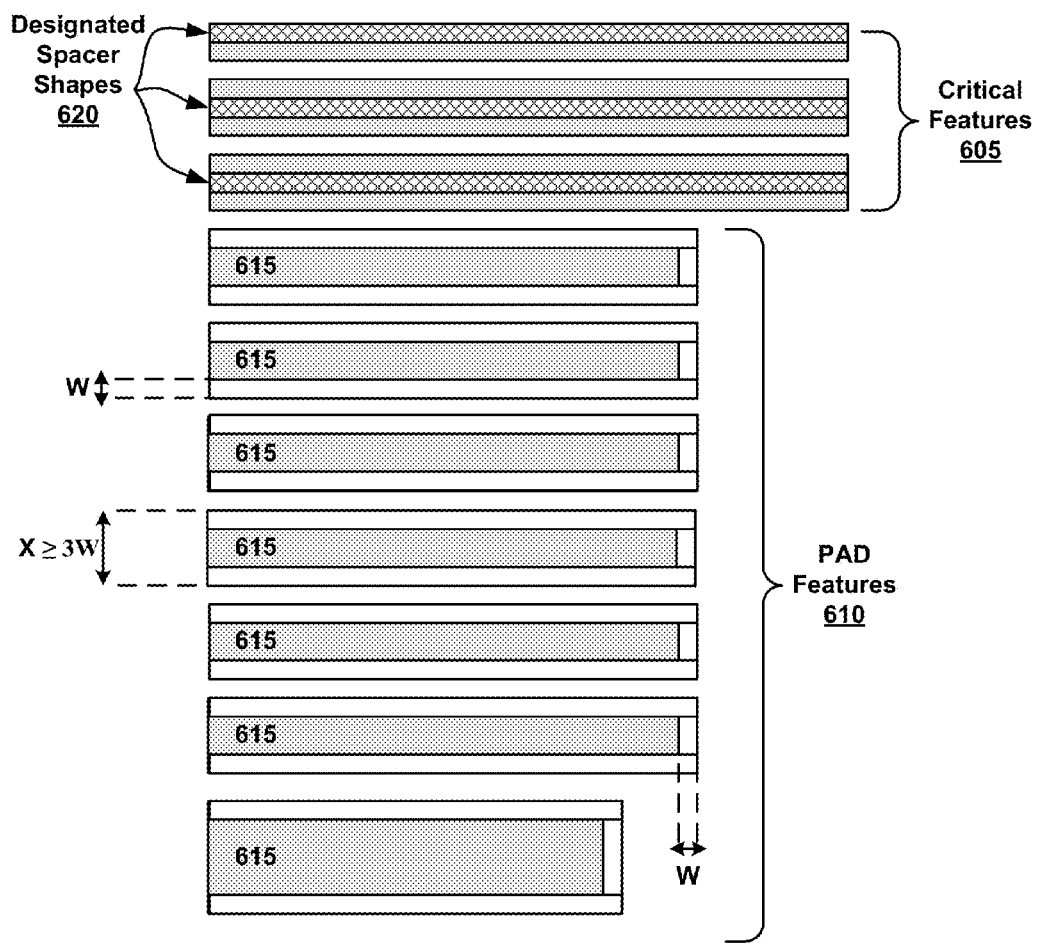

FIG. 6(B) illustrates an exemplary deconstruction of the design represented in FIG. 6(A). As shown in FIG. 6(B), the critical features 605 may be designated for a first or core mask. For the critical features, the pattern for small and closely spaced features may be created with the spacer material around a shape created with a sacrificial layer. Therefore, a single shape may be added to the first mask for a pair of critical features. For example, for each pair of critical features 605 in FIG. 6(B), the designated spacer shape 620 is shown. Each designated spacer shape may have width W equal to the space designed between the pair of features.

Figure 6C:
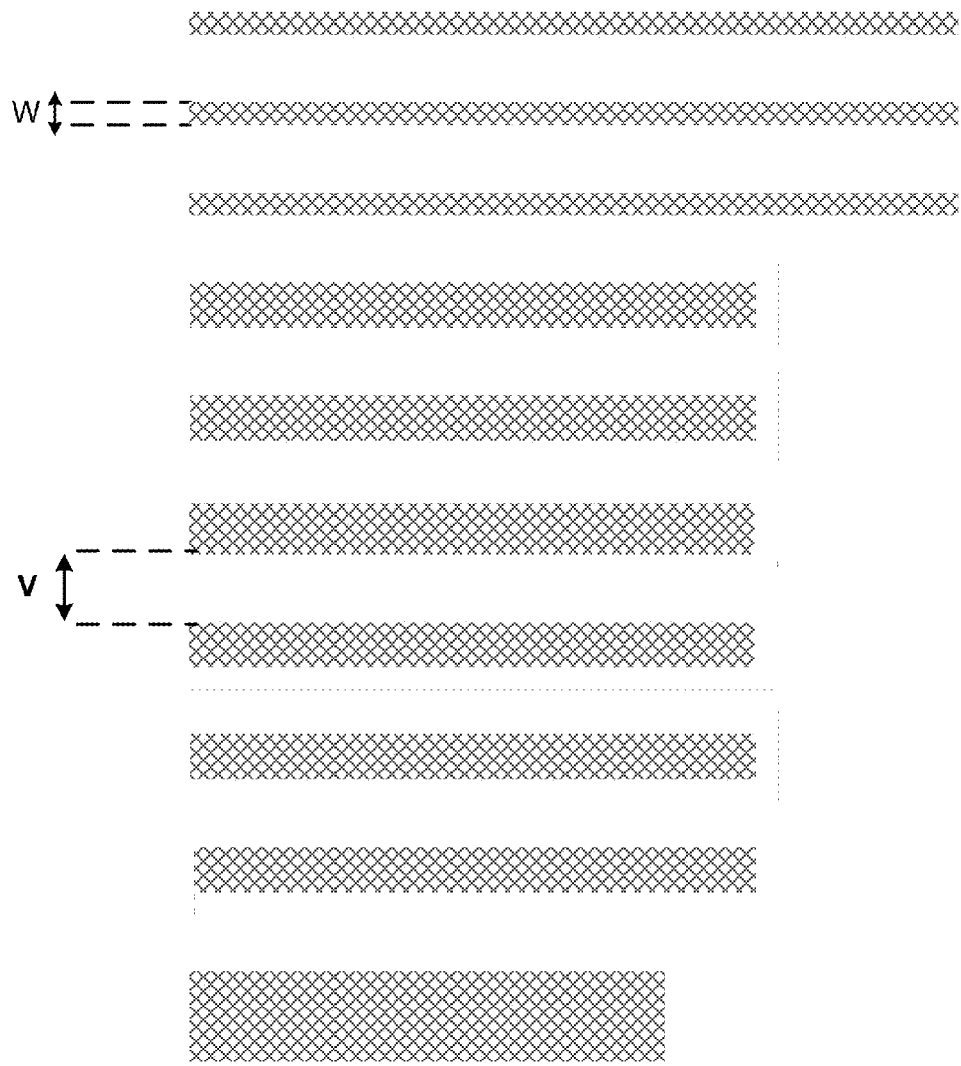

Pad features may be designated for the first mask if the pad feature has a width greater than 3W. For example, if the critical features have a 28 nm line or space width, then the pad feature must be at least 84 nm to be designated for the first mask. However, pad features may additionally be designated for the first mask if they are closely spaced. Conventional pad features are restricted by the photolithography process of patterning the features to a minimum space between features. The minimum spacing for pad features (V) on a mask is illustrated in FIG. 6(C). According to some embodiments, the minimum space between pad features is approximately 40 nm or greater for optical lithography using immersion 193 nm wavelength and high numerical aperture. Comparatively, pad features designated for the first mask may now be spaced at 28 nm.

Then the pad features may be reduced by W on all sides that will not be subsequently trimmed. As shown, the reduced pad features 615 may then be included in the first mask. Accordingly, FIG. 6(C) illustrates an exemplary first pattern that may be implemented with the first mask. As previously noted, the first pattern may be created by depositing and patterning a sacrificial material on the substrate. As shown, the designated shapes 620 that may pattern the critical features have a width W consistent with the space between the critical features in the target design.

Figure 6D:
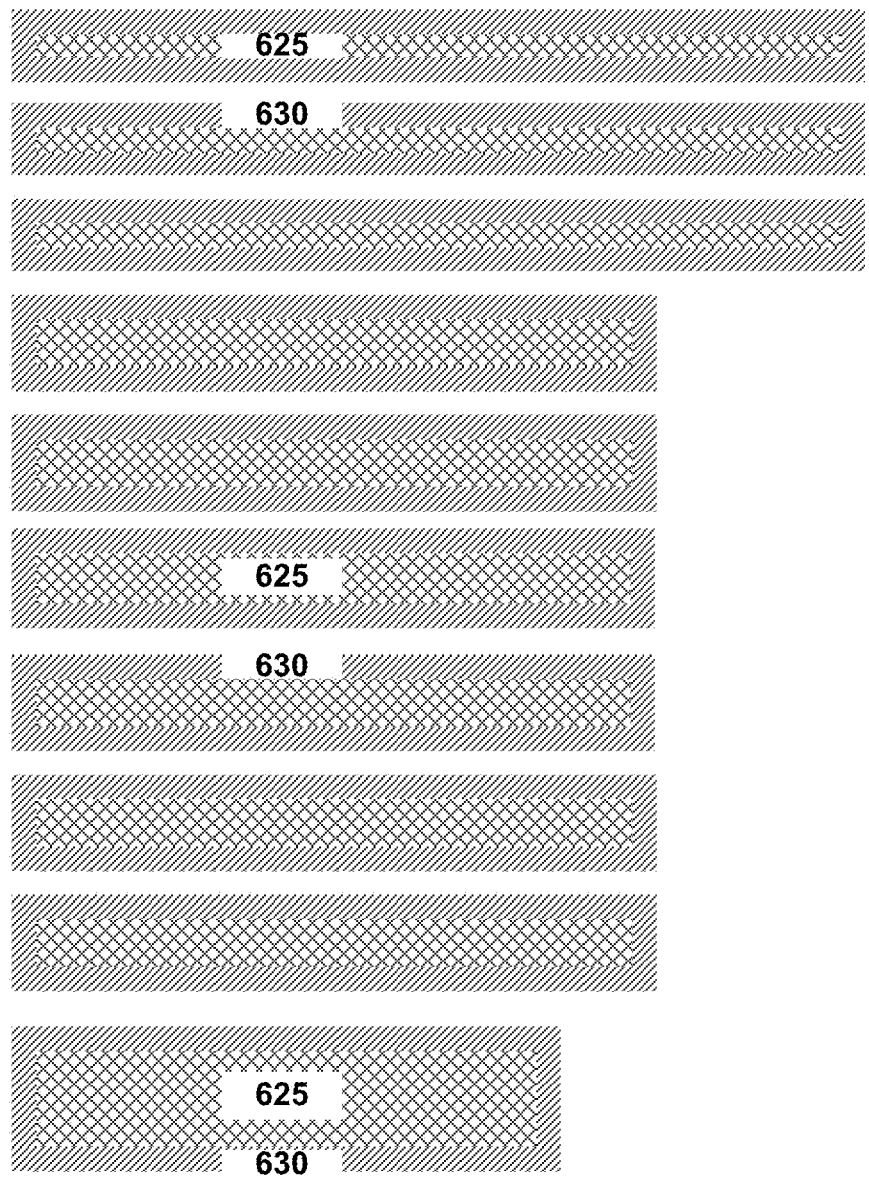
Figure 6E:

FIG. 6(D) illustrates the shapes implemented with the first mask 625 surrounded by spacer material 630. The pattern shown in FIG. 6(D) may be created by depositing and etching the spacer layer as described above. FIG. 6(E) then illustrates the spacer pattern remaining on the substrate after the first pattern is removed.

Figure 6F:
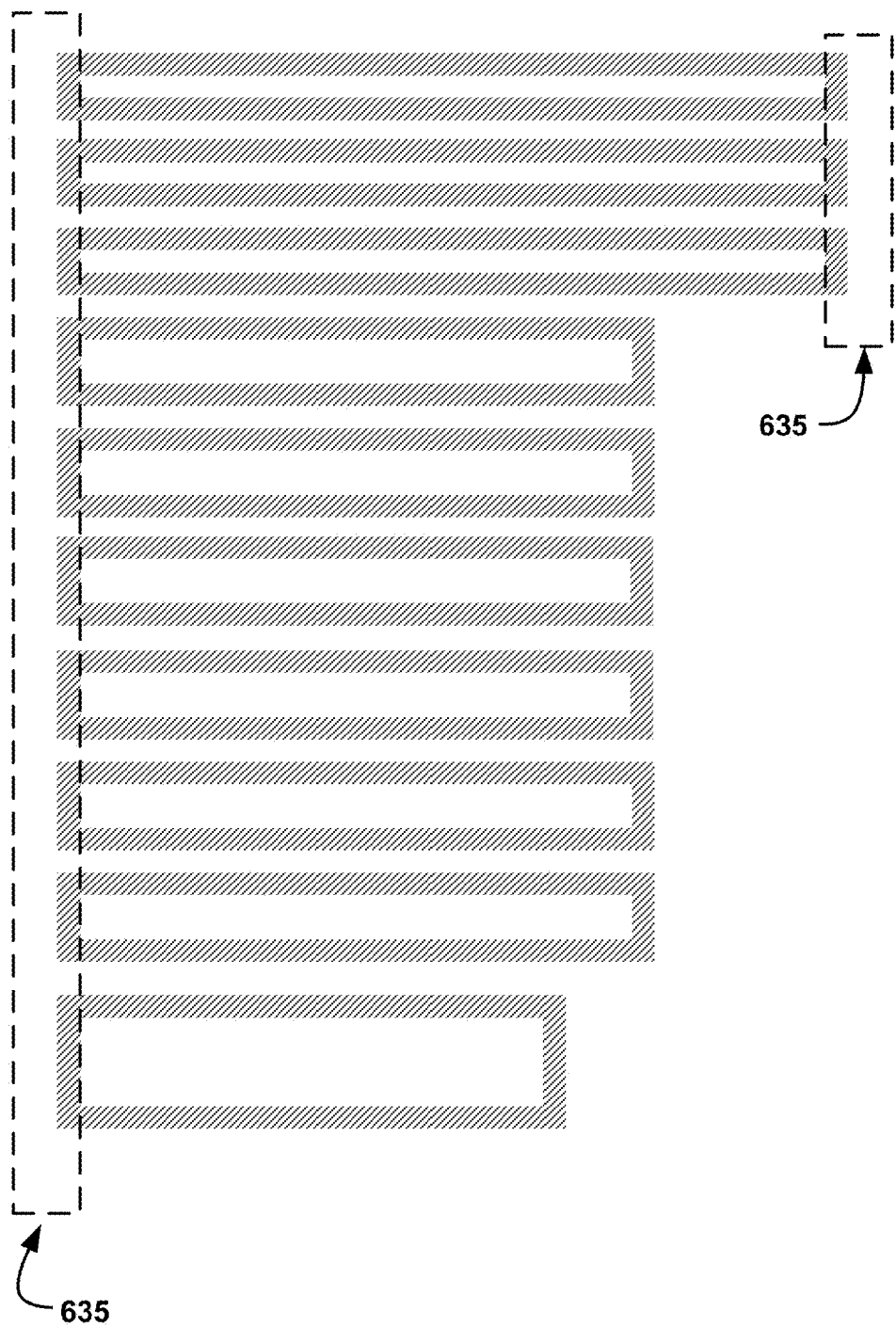
Figure 6G:
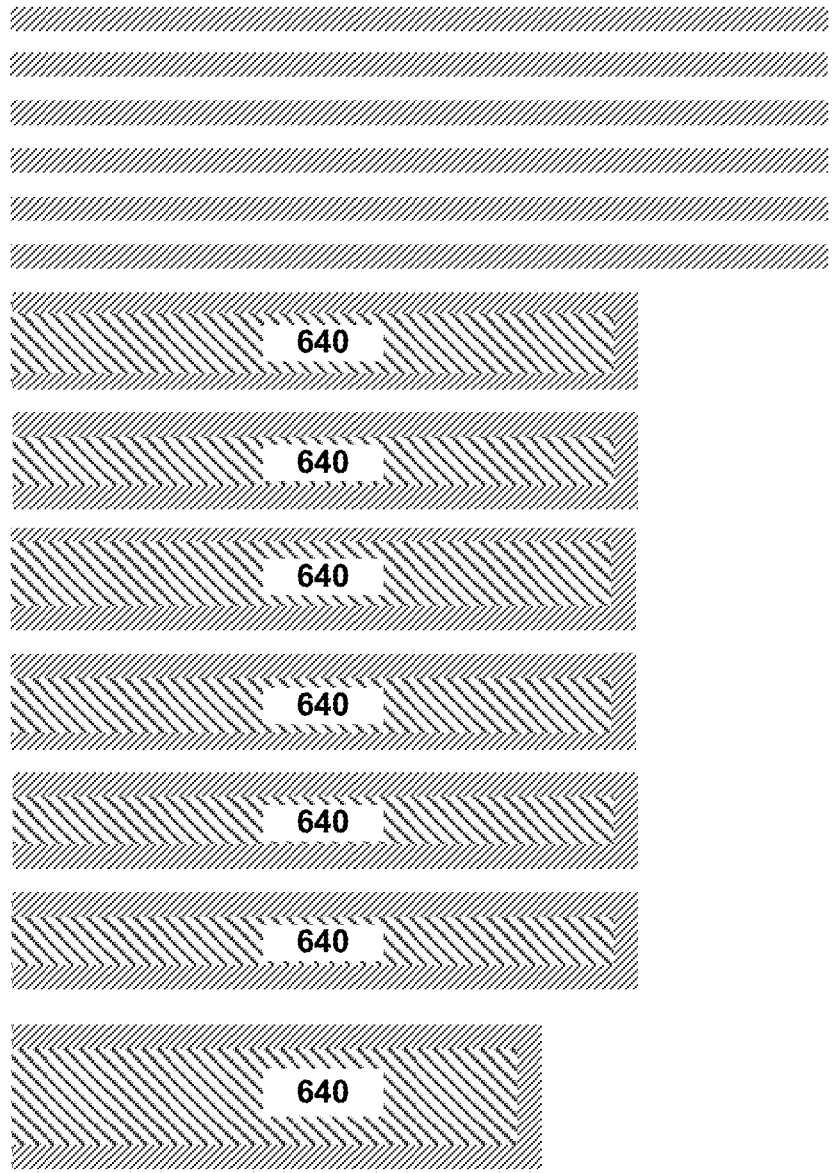
Figure 6H:
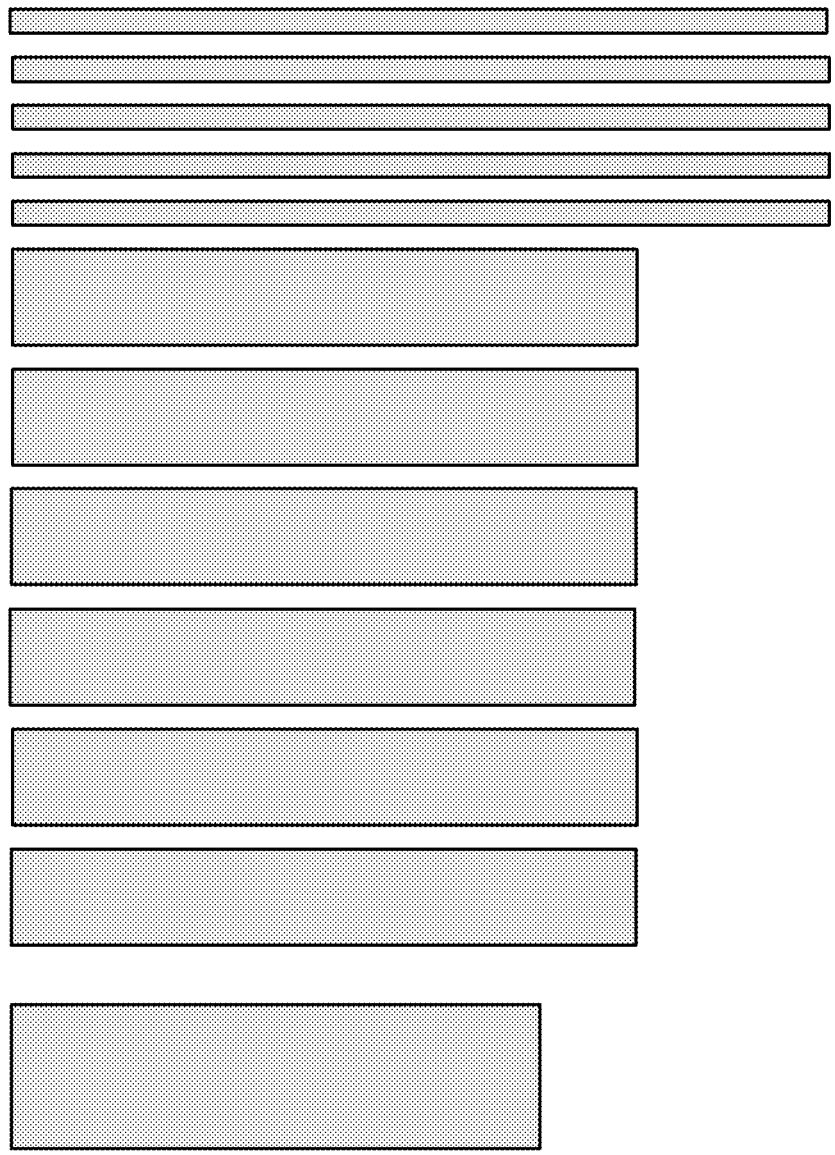

FIG. 6(F) illustrates one embodiment of a trim mask 635 that may be implemented to remove a portion of the spacer pattern that will not contribute to the target pattern. FIG. 6(G) shows the second pattern, including the pad features 640, as deposited over the spacer pattern. Finally, FIG. 6(H) illustrates the pattern that may then be transferred to the substrate layer.

Figure 7:
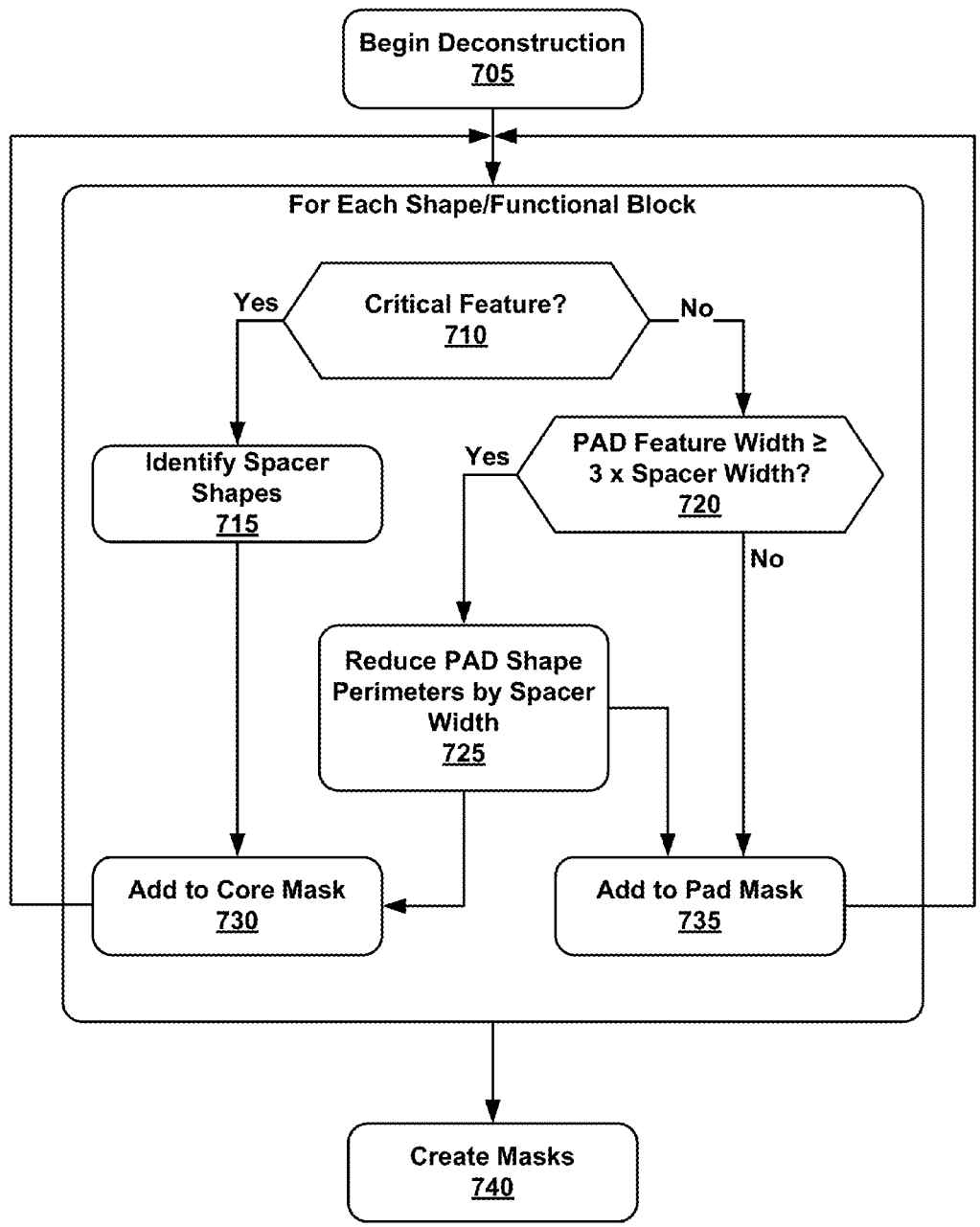
FIG. 7 is a flowchart illustrating an exemplary method for deconstructing a design layout in accordance with an embodiment of the present invention.

FIG. 7 is a flowchart illustrating an exemplary method for deconstructing a design layout in accordance with an embodiment of the present invention. This method may be used to derive a set of masks for patterning a design on a semiconductor substrate such that the small and closely spaced features are accurately aligned with one or more pad features.

As shown in FIG. 7, using a deconstruction tool as part of a design layout tool, each shape or functional block of shapes may be evaluated (block 705). For each shape or functional block, if the shape is a critical feature (block 710), or if the functional block includes critical features, the self-alignment double patterning process may identify the spacer shapes necessary to pattern the critical features (block 715). This may include identifying a space between a pair of critical features as the designated spacer shape to create the pattern for closely spaced critical features. The identified space may be added to the core mask. The designated spacer shapes may be included in the core mask (block 730).

For each shape or functional block, if the shape is not a critical feature, the shape or functional block may be considered a pad feature (block 710). If the pad feature has a dimension smaller than three times the minimum spacer width (block 720), the double-patterning process using spacer patterns will not be able to pattern the pad feature and the pad feature will be implemented solely with the pad mask (block 735). However, if the pad feature has dimensions greater than three times the minimum spacer width (block 720), a shape the size of the pad feature may be reduced by the minimum spacer size on each side (block 725) and the reduced pad shape may be added to the core mask (block 730).

The reduced pad shape implemented on the first mask may then form the base of a spacer pattern as described above. Then a shape for the pad feature may be further implemented with the pad mask such that the hardmask layer for the pad mask overlaps the spacer pattern (block 735). Accordingly, the pad feature implemented on the pad mask may be at least the size of the reduced pad shape but not as large as the original pad feature. The pad feature may then be aligned with the critical features and other pad features that are implemented with the first mask or pattern.

After the shapes of the layout have been deconstructed, the masks may then be derived (block 740). A core mask may be derived to implement the designated spacer shapes and reduced pad shapes identified during shape analysis. A trim mask may be formed to trim a portion of the spacer pattern that will not contribute to patterning the original layout. A pad mask may be derived that patterns the pad features with a hardmask such that the pad feature pattern overlaps but does not extend beyond the spacer pattern for the respective pad feature. Then, a photolithography process, such as described with respect to FIG. 3, may be implemented using the derived masks to pattern the original design layout on a semiconductor substrate such that the pad features and critical features are properly aligned.

In some applications, the modules described hereinabove may be provided as elements of an integrated software system, in which the blocks may be provided as separate elements of a computer program. Some embodiments may be implemented, for example, using a non-transitory computer-readable storage medium or article which may store an instruction or a set of instructions that, if executed by a processor, may cause the processor to perform a method in accordance with the disclosed embodiments. Other applications of the present invention may be embodied as a hybrid system of dedicated hardware and software components. Moreover, not all of the modules described herein need be provided or need be provided as separate units. Such implementation details are immaterial to the operation of the present invention unless otherwise noted above.

The exemplary methods and computer program instructions may be embodied on a non-transitory machine readable storage medium. In addition, a server or database server may include non-transitory machine readable storage media configured to store machine executable program instructions. The features of the embodiments of the present invention may be implemented in hardware, software, firmware, or a combination thereof and utilized in systems, subsystems, components or subcomponents thereof. The "machine readable storage media" may include any medium that can store information. Examples of a machine readable storage medium include electronic circuits, semiconductor memory device, ROM, flash memory, erasable ROM (EROM), floppy diskette, CD-ROM, optical disk, hard disk, fiber optic medium, or any electromagnetic or optical storage device.

What is claimed is:

1. A method of producing a dataset for creating a set of masks for patterning a plurality of features onto a substrate, the method comprising:
   generating, with a processor, a first mask, said generating the first mask comprising:
      identifying a subset of features to be patterned using the first mask, the subset of features including at least one pad feature, and
      deriving a first shape for patterning part of the at least one pad feature with the first mask, wherein the first shape is smaller than the at least one pad feature by a predetermined value; and
   generating, with the processor, a second mask, said generating the second mask comprising deriving a second shape for patterning part of the at least one pad feature with the second mask, wherein the second shape is smaller than the at least one pad feature and larger than the first shape and wherein the first shape and the second shape will overlap when patterned on the substrate;

wherein the first mask and the second mask are used to fabricate an integrated circuit.

2. The method of claim 1, wherein the predetermined value is a minimum width for features patterned on the substrate.

3. The method of claim 1, wherein the at least one pad feature has a width greater than or equal to three times the predetermined value.

4. The method of claim 1, wherein said deriving the first shape further comprises:
reducing the shape of the at least one pad feature on all sides by the predetermined value.

5. The method of claim 1, wherein the subset of features further comprises an array of lines.

6. The method of claim 5, wherein each line in the array of lines has a width equivalent to the predetermined value.

7. The method of claim 1, further comprising:
generating a third mask used to trim a pattern of spacer material.

8. A non-transitory computer readable medium storing instructions that when executed by a processor perform a method for creating a set of masks for patterning a plurality of features onto a substrate, the method comprising:
generating a first mask, said generating the first mask comprising:
identifying a subset of features to be patterned using the first mask, the subset of features including at least one pad feature, and
deriving a first shape for patterning part of the at least one pad feature with the first mask, wherein the first shape is smaller than the at least one pad feature by a predetermined value; and
generating a second mask, said generating the second mask comprising deriving a second shape for patterning part of the at least one pad feature with the second mask, wherein the second shape is smaller than the at least one pad feature and larger than the first shape and wherein the first shape and the second shape will overlap when patterned on the substrate;
wherein the first mask and the second mask are used to fabricate an integrated circuit.

9. The computer readable medium of claim 8, wherein the predetermined value is a minimum width for features patterned on the substrate.

10. The computer readable medium of claim 8, wherein the at least one pad feature has a width greater than or equal to three times the predetermined value.

11. The computer readable medium of claim 8, wherein said deriving the first shape comprises creating a shape that is smaller than the at least one pad feature by the predetermined value on all sides.

12. A system comprising:
a memory to store a plurality of circuit design layouts; and
a processor configured to produce a set of masks for patterning a layout onto a substrate, said masks comprising:
a first mask including a first shape for at least one pad feature wherein the first shape for the at least one pad feature is smaller than the at least one pad feature by a predetermined value; and
a second mask including a second shape for the at least one pad feature, wherein the second shape is smaller than the at least one pad feature and larger than the first shape and wherein the first shape and the second shape will overlap when patterned on the substrate;
wherein the first mask and the second mask are used to fabricate an integrated circuit.

13. The system of claim 12, wherein the predetermined value is a minimum width for features patterned on the substrate.

14. A method of patterning a plurality of features onto a substrate, the method comprising:
patterning a first layer onto the substrate to form a first pattern, wherein the first pattern defines a layout for a first subset of the plurality of features, the subset includes at least one pad feature, and the first pattern includes a first shape, associated with the at least one pad feature, that is smaller than the at least one pad feature;
depositing a spacer material over the first pattern on the substrate;
preferentially removing spacer material on horizontal surfaces of the substrate while retaining spacer material adjacent to vertical edges of the first pattern;
removing the first pattern from the substrate to form a pattern of trenches defined by the remaining spacer material;
depositing a second layer onto the pattern of trenches to form a second pattern, wherein the second pattern includes a second shape associated with the at least one pad feature, the second shape overlapping a portion of the remaining spacer material; and
patterning the plurality of features onto the substrate using the pattern of trenches and the second pattern to define the plurality of features.

15. The method of claim 14, further comprising:
identifying a minimum width for features patterned on the substrate.

16. The method of claim 14, wherein the at least one pad feature has a width greater than or equal to three times the identified minimum width.

17. The method of claim 14, wherein the plurality of features includes an array of lines.

18. The method of claim 17, wherein each line in the array of lines has a width equivalent to the identified minimum width.

19. The method of claim 14, further comprising:
trimming the remaining spacer material to adjust the pattern of trenches.

* * * * *